(12) United States Patent  
Chen et al.

(10) Patent No.: US 9,036,344 B2  
(45) Date of Patent: May 19, 2015

(54) ELECTRONIC DEVICE

(71) Applicants: Inventec (Pudong) Technology Corporation, Shanghai (CN); INVENTEC CORPORATION, Taipei (TW)

(72) Inventors: Jing Chen, Shanghai (CN); Chien-Lung Chen, Taipei (TW)

(73) Assignees: Inventec (Pudong) Technology Corporation, Shanghai (CN); INVENTEC CORPORATION, Taipei (TW)

( * ) Notice: Subject to any disclaimer, the term of this patent is extended or adjusted under 35 U.S.C. 154(b) by 344 days.

(21) Appl. No.: 13/761,139

(22) Filed: Feb. 6, 2013

(65) Prior Publication Data

US 2014/0133086 A1    May 15, 2014

(30) Foreign Application Priority Data

Nov. 12, 2012    (CN) .......................... 2012 1 0451081

(51) Int. Cl.
| | |
|---|---|
| *H05K 7/20* | (2006.01) |
| *G06F 1/20* | (2006.01) |
| *H01L 23/473* | (2006.01) |

(52) U.S. Cl.
CPC .............. *H05K 7/20145* (2013.01); *G06F 1/20* (2013.01)

(58) Field of Classification Search
CPC ........... H05K 7/20218–7/20381; H01L 23/473
USPC ........................ 361/679.46–679.54, 688–723, 361/724–727; 165/80.1–80.5, 104.33, 185; 174/15.1–15.3, 16.1–16.3, 521, 526, 174/547–548; 454/184; 248/165; 211/26
See application file for complete search history.

(56) References Cited

U.S. PATENT DOCUMENTS

| | | | |
|---|---|---|---|
| 6,005,773 A * | 12/1999 | Rozman et al. ................ | 361/707 |
| 6,058,009 A * | 5/2000 | Hood et al. .............. | 361/679.47 |
| 6,359,779 B1 * | 3/2002 | Frank et al. .............. | 361/679.47 |
| 6,504,718 B2 * | 1/2003 | Wu ................................. | 361/695 |
| 7,108,051 B2 * | 9/2006 | Hung ............................ | 165/122 |
| 7,203,063 B2 * | 4/2007 | Bash et al. .................... | 361/699 |
| 7,209,352 B2 * | 4/2007 | Chen ............................. | 361/695 |

(Continued)

FOREIGN PATENT DOCUMENTS

| | | |
|---|---|---|
| CN | 102455757 A | 5/2012 |
| TW | I291321 | 12/2007 |
| TW | I329490 | 8/2010 |

*Primary Examiner* — Anthony Haughton
*Assistant Examiner* — Razmeen Gafur
(74) *Attorney, Agent, or Firm* — CKC & Partners Co., Ltd.

(57) ABSTRACT

An electronic device includes a motherboard, a plurality of heating modules arranged on the motherboard, a first electronic module arranged on a front side of the motherboard along a longitudinal direction, a second electronic module stacked above the first electronic module, a wind scooper and a fan module being located on a rear side of the motherboard along the transverse direction and facing the heating modules and the second electronic module. The wind scooper covers the heating modules, and has a partition board to form a lower-layer airflow passage and an upper-layer airflow passage. The wind scooper guides a first airflow from the fan module to flow through the heating modules along the lower-layer airflow passage, and guides a second airflow from the fan module to flow to the second electronic module through the upper-layer airflow passage, without flowing through the heating modules.

18 Claims, 10 Drawing Sheets

(56) References Cited

U.S. PATENT DOCUMENTS

| | | | |
|---|---|---|---|
| 7,345,873 B2 * | 3/2008 | Dey et al. | 361/695 |
| 7,391,618 B2 * | 6/2008 | Fujiya et al. | 361/727 |
| 7,760,498 B2 * | 7/2010 | Shan et al. | 361/695 |
| 7,920,381 B2 * | 4/2011 | Kitahara | 361/695 |
| 7,957,132 B2 * | 6/2011 | Fried | 361/679.47 |
| 8,045,328 B1 * | 10/2011 | Chen | 361/695 |
| 8,077,458 B2 * | 12/2011 | Guan | 361/695 |
| 8,295,051 B2 * | 10/2012 | Cheng | 361/727 |
| 8,405,987 B2 * | 3/2013 | Lai | 361/695 |
| 8,605,427 B2 * | 12/2013 | Chen et al. | 361/679.49 |
| 8,717,763 B2 * | 5/2014 | Lin et al. | 361/695 |
| 2006/0291171 A1 * | 12/2006 | Ahrens | 361/716 |
| 2008/0259566 A1 * | 10/2008 | Fried | 361/699 |
| 2009/0185348 A1 * | 7/2009 | Bretschneider et al. | 361/695 |
| 2012/0145363 A1 * | 6/2012 | Peng et al. | 165/121 |
| 2014/0146471 A1 * | 5/2014 | Liu | 361/695 |

* cited by examiner

ELECTRONIC DEVICE

RELATED APPLICATIONS

This application claims priority to China Application Serial Number 201210451081.8, filed Nov. 12, 2012, which is herein incorporated by reference.

BACKGROUND

1. Technical Field

The present disclosure relates to an electronic device. More particularly, the present disclosure relates to a server.

2. Description of Related Art

In recent years, with the rapid development of science and technology, the operation speed of an electronic device is being constantly increased. Additionally, with the efficiency improvement of the electronic device, the heating power of electronic parts of the electronic device is also constantly increased. In order to prevent the temporary or permanent failure of the electronic parts due to overheat, the electronic device should provide the electronic parts with sufficient heat dissipation energy. Therefore, for the electronic parts with high heating power (such as a central processing unit or graphics chip and the like), generally heat dissipation modules such as heat dissipation fins are additionally arranged to decrease the temperature of these electronic parts. Additionally, the electronic parts are generally located in an enclosure of the electronic device. In order to dissipate the heat absorbed by the heat dissipation modules fully out of the enclosure, the efficiency of heat convection in the enclosure is also one of problems worthy of attention.

For a server, the server should have enough stability and reliability to prevent the service provided thereby from being interrupted. Therefore, a flow guiding structure with an auxiliary heat dissipation function is often arranged in the enclosure of the server to increase the efficiency of heat convection. For example, fans may be arranged on one side of a motherboard in the server, and moreover, various wind scoopers are arranged in the front of the fans, and at the locations of the electronic parts such as power supplies or hard disks and the like, so that the airflow blown out by the fans can be guided by these wind scoopers to flow into these electronic parts, and thus the heat generated by these electronic parts is dissipated out of the enclosure. As a result, the temperature of the server decreased and the operation thereof is stabilized.

However, since the wind scoopers can guide the flowing direction of the airflow blown out from the fan, the configuration models of the wind scoopers affect the heat dissipation efficiency of the electronic device. That is, after the airflow passes through the electronic parts which generate heat, the temperature thereof is increased since the airflow carries the heat generated by the electronic parts. At this moment, the same airflow fails to continue to cool other electronic parts. Therefore, poor heat dissipation efficiency of the electronic device is easily caused.

SUMMARY

The present disclosure provides an electronic device having good heat dissipation efficiency.

The present disclosure provides an electronic device, including a motherboard, a plurality of heating modules, a first electronic module, a second electronic module, a fan module and a wind scooper. The heating modules are arranged on motherboard. The first electronic module is arranged on a front side of the motherboard along a longitudinal direction perpendicular to a transverse direction. The second electronic module is arranged on the front side of the motherboard, and further stacked above the first electronic module. The fan module is located on a rear side of the motherboard along the transverse direction, and further faces the heating modules and the second electronic module. The wind scooper covers the heating modules, and has a partition board extending toward the first electronic module, so that a lower-layer airflow passage is formed between the partition board and the motherboard, and an upper-layer airflow passage is formed above the partition board. The wind scooper guides a first airflow provided by the fan module to flow through the heating modules along the lower-layer airflow passage, and guides a second airflow provided by the fan module to flow to the second electronic module along the upper-layer airflow passage without flowing through the heating modules.

In an embodiment of the present disclosure, the electronic device mentioned above further includes a power-supply wind scooper. The first electronic module is a power module. The power module has a power-supply opening. The power-supply opening is arranged towards the fan module and further faces the lower-layer airflow passage and the heating modules. The power-supply wind scooper is arranged to shield a part of power-supply opening, so that the first airflow flowing through the heating modules is prevented by the power-supply wind scooper from flowing into the power module.

In an embodiment of the present disclosure, the electronic device mentioned above further includes a case, and the motherboard is arranged in the case. The case has a lateral wall adjacent to the wind scooper and the power module. The power-supply wind scooper mentioned above has an air inlet, located on one side of the power-supply wind scooper and further facing the lateral wall. A third airflow provided by the fan module flows to the power module along a gap between the lateral wall and the wind scooper. A part of the third airflow enters the power module through the part of the power-supply opening not shielded by the power-supply wind scooper. In addition, another part of the third airflow passes through the air inlet and the part of the power-supply opening shielded by the power-supply wind scooper in sequence to enter the power module.

In an embodiment of the present disclosure, the electronic device mentioned above further includes a power line for connecting the motherboard with the power module. The power-supply wind scooper has are internal face facing the power-supply opening and an external face facing the fan module. The power line is arranged on the external face of the power-supply wind scooper so that the motherboard is prevented from being interfered.

In an embodiment of the present disclosure, the power-supply wind scooper mentioned above has a line arrangement hook, which is located on the external face of the power-supply wind scooper. The power line is fixed on the power-supply wind scooper by the line arrangement hook.

In an embodiment of the present disclosure, the wind scooper mentioned above includes an air inlet and a plurality of first air outlets. The air inlet of the wind scooper, corresponding to the fan module, is located on a first side of the wind scooper. The first air outlets, corresponding to the heating modules, are arranged in the lower-layer airflow passage, and further located on a second side of the wind scooper relative to the first side, so that the first airflow can pass through the heating modules via the first air outlets from the air inlet.

In an embodiment of the present disclosure, the fan module mentioned above includes a fan bracket and a plurality of fans. The fans are arranged in the fan bracket. The fan bracket has at least one positioning hole. The air inlet has at least one positioning column. The wind scooper is assembled to the fan module by enabling the positioning columns to correspondingly penetrate into the positioning holes.

In an embodiment of the present disclosure, each of the heating modules includes a heating element, a heat dissipation element and a heat dissipation enclosure. The heat dissipation element is arranged in the heat dissipation enclosure and further thermally coupled with the heating element. The heat dissipation enclosure has a fastening convex part. Each of the first air outlets has a corresponding fastener. The fastener has a fastening hook part. The wind scooper is fixed to the heating modules by fastening the fastening hook parts correspondingly onto the fastening convex parts.

In an embodiment of the present disclosure, each of the fasteners has a pressing part. The pressing part protrudes above the first air outlet. For the wind scooper, the fastening relation between the fastening hook parts and the fastening convex parts are released by pressing the pressing parts.

In an embodiment of the present disclosure, the electronic device mentioned above further includes at least one memory module, which is arranged on the motherboard along the transverse direction and further adjacent to the heating modules. The wind scooper further includes at least one second air outlet, which is arranged in the lower-layer airflow passage and further located on the second side of the wind scooper corresponding to the at least one memory module, so that the first airflow can flow through the memory module via the second air outlets from the air inlet.

In an embodiment of the present disclosure, two heating modules and two memory modules are staggerly arranged on the motherboard. Also, two first air outlets and two second air outlets are staggerly arranged on the second side, so that the first air outlets and the second air outlets respectively correspond to the heating modules and the memory modules.

In an embodiment of the present disclosure, the electronic device mentioned above further includes a power-supply wind scooper and the first electronic module is a power module. The power module has a power-supply opening arranged toward the lower-layer airflow passage. The power-supply wind scooper is arranged between the power-supply opening and the heating modules to prevent the first airflow from flowing into the power module through the power-supply opening.

In an embodiment of the present disclosure, the electronic device mentioned above further includes a hard disk wind scooper. The second electronic module is a hard disk module. The hard disk module has a hard disk opening. The hard disk opening is arranged towards the upper-layer airflow passage. The hard disk wind scooper is attached to the hard disk module, and further is rotatable between a first position and a second position. When the hard disk wind scooper is at the first position, the hard disk wind scooper shields the hard disk opening. When the hard disk wind scooper is at the second position, the hard disk wind scooper exposes the hard disk opening to the fan module so that the second airflow passing through the upper-layer airflow passage flows along a top face of the hard disk wind scooper to enter the hard disk module through the hard disk opening.

When the hard disk wind scooper is at the second position, the power-supply wind scooper is between the hard disk wind scooper and the motherboard so that the first airflow flowing through the heating modules is prevented by the hard disk wind scooper from spreading upwardly to enter the hard disk module.

In an embodiment of the present disclosure, the hard disk wind scooper mentioned above has a fixing hook. The power-supply wind scooper has a fixing hole located on a top part of the power-supply wind scooper. When the hard disk wind scooper is at the second position, the hard disk wind scooper is attached to the power-supply wind scooper by fastening the fixing hook into fixing hole.

In an embodiment of the present disclosure, the electronic device mentioned above further includes a gap layer between the power module and the hard disk module, and at least part of the first airflow flows out of the electronic device via the gap layer. The at least part of the first airflow flows into the gap layer via a gap between the hard disk wind scooper and the power-supply wind scooper.

In an embodiment of the present disclosure, the electronic device mentioned above further includes a case. The case has an accommodation space. The motherboard and the fan module are arranged in the case, so that the first airflow and the second airflow flow in the accommodation space through the wind scooper, and further flow out of the case for heat dissipation.

Based on the description above, the present disclosure provides an electronic device. The wind scooper covers the heating modules, and further forms the lower-layer airflow passage and the upper-layer airflow passage through the partition board, so that a first airflow provided by the fan module is guided to flow through the heating modules along the lower-layer airflow passage, and a second airflow provided by the fan module is guided to flow to the second electronic module along the upper-layer airflow passage without flowing through the heating modules. Therefore, the operation temperatures of the heating modules and the second electronic module are respectively decreased. Accordingly, the electronic device has good heat dissipation efficiency.

In order to make the features and advantages above of the present disclosure more apparent, specific embodiments are listed hereafter to make a detailed description with reference to the accompanying drawings.

DETAILED DESCRIPTION

Figure 1:
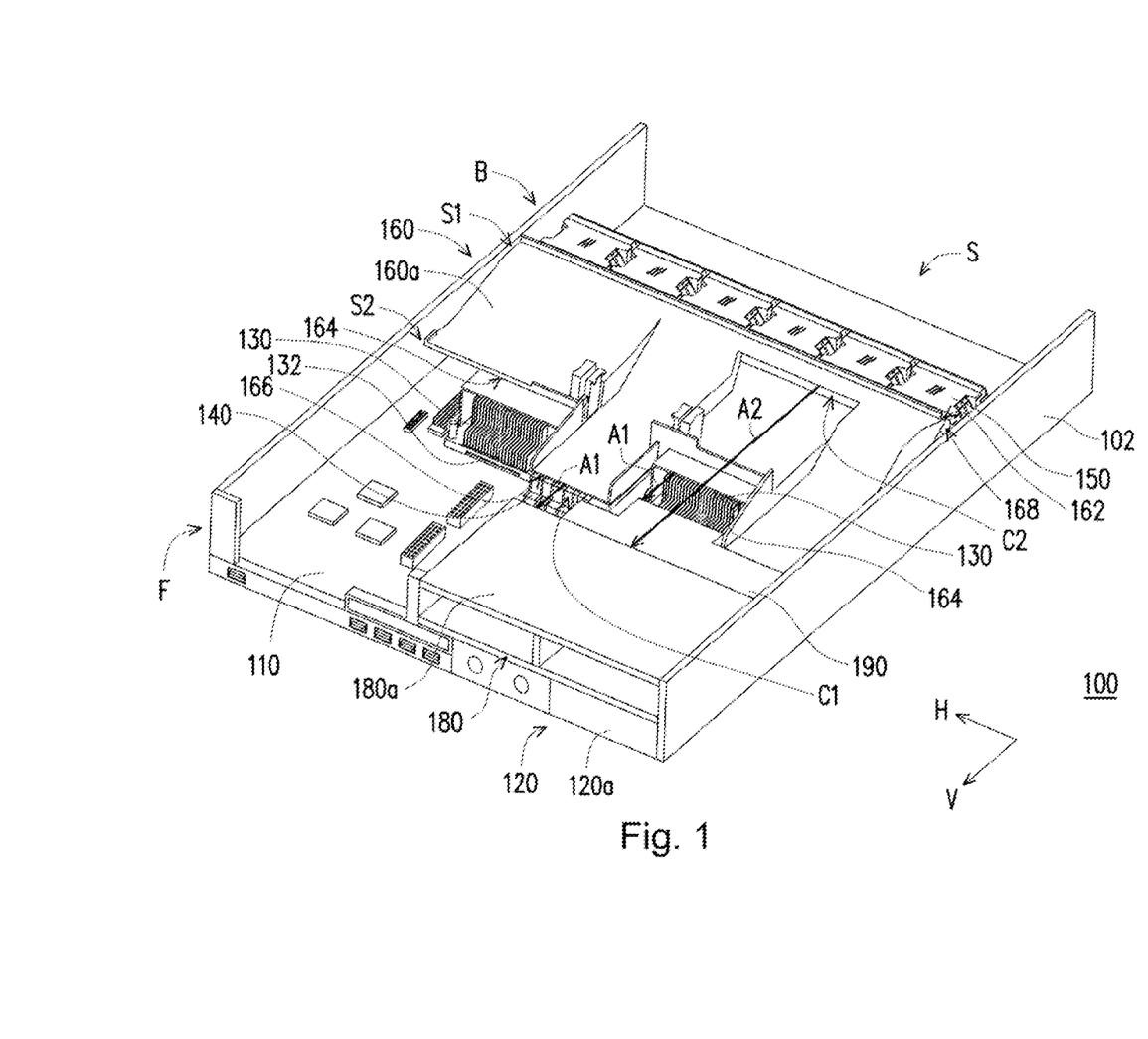
FIG. 1 is a schematic diagram of an electronic device according to an embodiment of the present disclosure.
Figure 2:
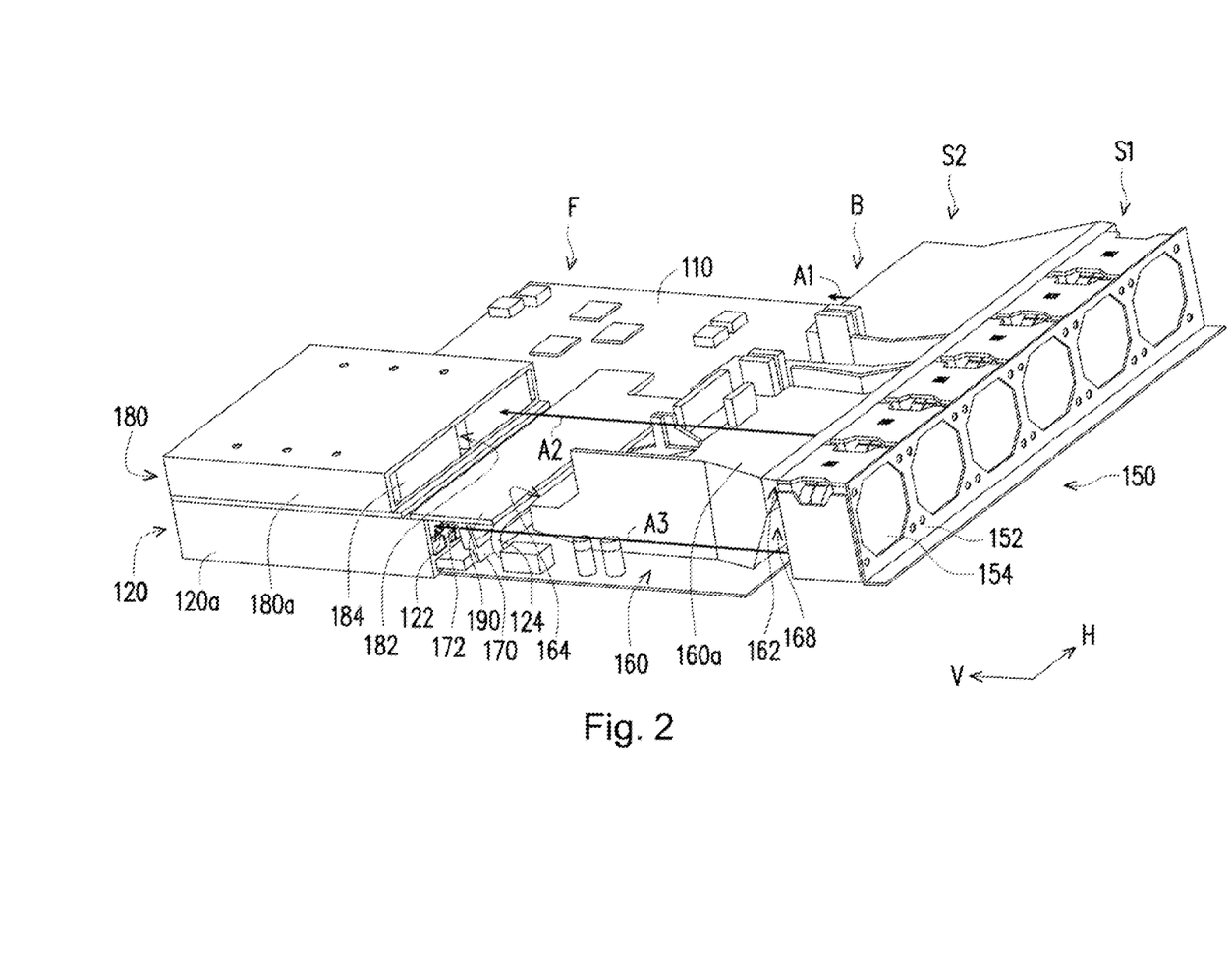
FIG. 2 is a schematic diagram of the electronic device shown in FIG. 1 viewed from another perspective.

FIG. 1 is a schematic diagram of an electronic device according to an embodiment of the present disclosure. FIG. 2 is a schematic diagram of the electronic device shown in FIG. 1 viewed from another perspective. In order to make the diagram clearer, the case 102 is omitted in FIG. 2. Referring to FIGS. 1 and 2, in this embodiment, the electronic device 100 include a motherboard 110, a first electronic module 120, two heating modules 130, two memory modules 140, a fan module 150, a wind scooper 160, a power-supply wind scooper 170, a second electronic module 180 and a hard disk wind scooper 190. The electronic device 100, for example, is a server, but the type of the electronic device 100 is not limited in the present disclosure.

Particularly, in this embodiment, the electronic device 100 has the case 102. The case 102 has an accommodation space S. The motherboard 110 and the fan module 150 are arranged in the case 102. Two heating modules 130 are arranged on the motherboard 110 along the transverse direction H. The first electronic module 120 is arranged on the front side F of the motherboard 110 along the longitudinal direction V perpendicular to the transverse direction H. The second electronic module 180 is arranged on the front side F of the motherboard 110 and further stacked above the first electronic module 120. Two memory modules 140 are arranged on the motherboard 110 along the transverse direction H, and further are adjacent to the heating modules 130.

Since the number of the heating modules 130 and that of the memory modules 140 are respectively two, the heating modules 130 and the memory modules 140 of this embodiment are staggerly arranged on the motherboard 110. However, in other embodiments, the number and the position of the heating modules 130 and the memory modules 140 are respectively adjusted according to demands, and are not limited to the present disclosure.

Additionally, the fan module 150 is arranged in the case 102 along the transverse direction H, and further located on the rear side B of the motherboard 110 relative to the front side F so as to be electrically connected to the motherboard 110. The fan module 150 faces the heating modules 130, the memory modules 140, the first electronic module 120 and the second electronic module 180, so that the airflow provided by the fan module 150 is blown to the heating modules 130, the memory modules 140, the first electronic module 120 and the second electronic module 180.

Particularly, in this embodiment, the wind scooper 160 is fixed to the fan module 150 and the heating modules 130 by being assembled thereon. The wind scooper 160 covers the heating modules 130, and has a partition board 160a extending to the first electronic module 120 from the fan module 150, so that a lower-layer airflow passage C1 is formed between the partition board 160a and the motherboard 110, and an upper-layer airflow passage C2 is formed above the partition board 160a.

The wind scooper 160 guides the first airflow A1 provided by the fan module 150 to flow through the heating modules 130 along the lower-layer airflow passage C1, and guides the second airflow A2 provided by the fan module 150 to flow to the second electronic module 180 along the upper-layer airflow passage C2 without flowing through the heating modules 130. Therefore, the first airflow A1 and the second airflow A2 provided by the fan module 150 is separated by the lower-layer airflow passage C1 and the upper-layer airflow passage C2 of the wind scooper 160 to respectively flow towards the heating modules 130, the memory modules 140, the first electronic module 120 and the second electronic module 180, so that the heat dissipation efficiency of the electronic device 100 is improved.

Additionally, in this embodiment, the first electronic module 120 is a power module 120a, and the power-supply wind scooper 170 is arranged on the power module 120a. After the first airflow A1 flows through the heating modules 130 and the memory module 140 along the lower-layer airflow passage C1, the first airflow A1 is heated as carrying the generated heat. If the heated first airflow A1 flows into the power module 120a, the heat dissipation efficiency of the power module 120a is affected. Therefore, through the arrangement of the power-supply wind scooper 170, the first airflow A1 flowing through the heating modules 130 and the memory module 140 can be effectively prevented from flowing into the power module 120a. However, the type of the first electronic module 120 is not limited in the present disclosure. Herein, the power module 120a is described only as an example of the first electronic module 120.

It can be seen that the first airflow A1 and the second airflow A2 provided by the fan module 150 can flow in the accommodation space S of the case 102 under the guidance of the wind scooper 160, and can carry the heat generated by all the electronic parts of the electronic device 100 to dissipate out of the electronic device 100. Therefore, the operation temperatures of the first electronic module 120, the heating modules 130, the memory modules 140 and the second electronic module 180 are decreased. In addition, the power-supply wind scooper 170 can effectively prevent the first airflow A1 which is heated when flowing through the heating modules 130, from flowing into the power module 120a to affect the heat dissipation efficiency. The wind scooper 160 and the power-supply wind scooper 170 are introduced orderly hereafter.

Figure 3:
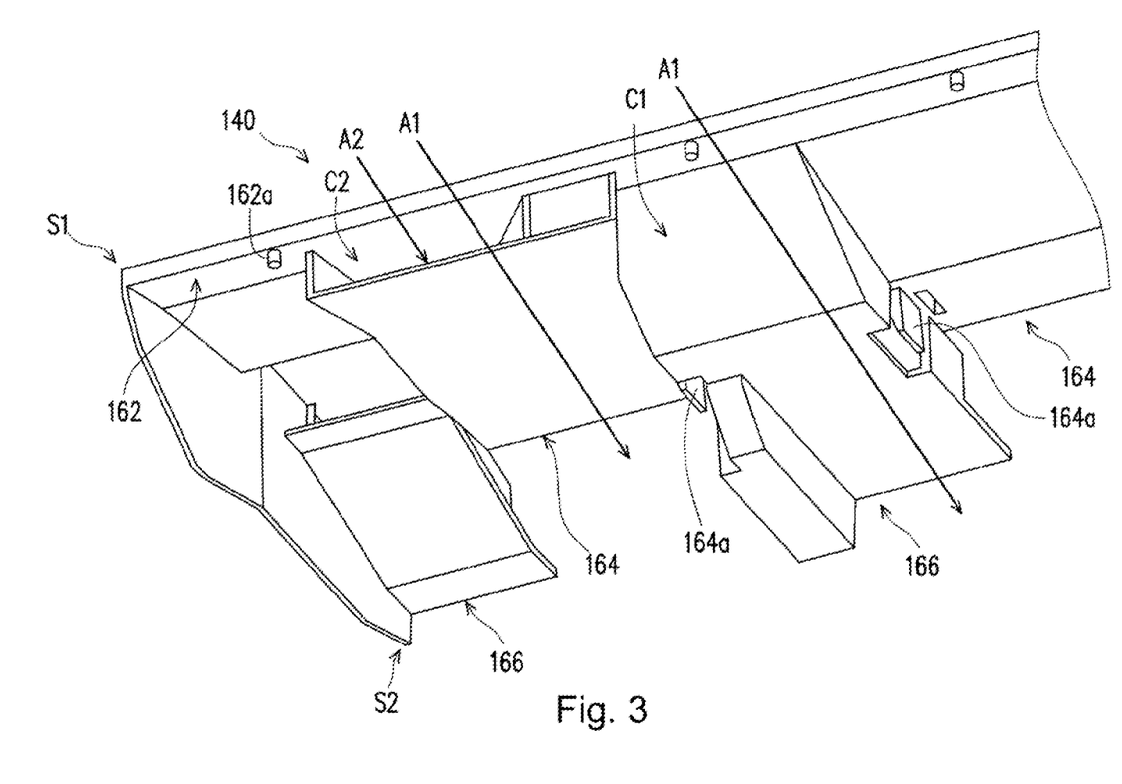
FIG. 3 is a schematic diagram of a wind scooper shown in FIG. 1.

FIG. 3 is a schematic diagram of a wind scooper shown in FIG. 1. Referring both to FIGS. 1 and 3, in this embodiment, the wind scooper 160 includes an air inlet 162, two first air outlets 164 and two second air outlets 166. The air inlet 162 is located on a first side S1 of the wind scooper 160 and corresponding to the fan module 150. The first air outlets 164, corresponding to the heating modules 130, are arranged in the lower-layer airflow passage C1, and further located on a second side S2 of the wind scooper 160 relative to the first side S1. The second air outlets 166, corresponding to the memory modules 140, are arranged in the lower-layer airflow passage C1, and further located on the second side S2 of the wind scooper 160 as being adjacent to the first air outlets 164.

In this embodiment, the number of the first air outlets 164 and that of the second air outlets 166 are respectively two. Moreover, the two first air outlets 164 and the two second air outlets 166 are staggerly located on the second side S2, so that the first air outlets 164 and the second air outlets 166 respectively correspond to the heating modules 130 and the memory modules 140. Accordingly, the first airflow A1 provided by the fan module 150 can flow through the heat modules 130 via the first air outlets 164 (one first air outlet 164 is drawn as an example) from the air inlet 162. Moreover, the first airflow A1 flows through the memory modules 140 via the second air outlets 166 (one second air outlet 166 is drawn as an example) from the air inlet 162. Therefore, the heat dissipation efficiency of the electronic device 100 is improved. However, in other embodiments, the number and the position of the first air outlets 164 and the second air outlets 166 may be adjusted according to the number and the position the heating modules 130 and the memory modules 140, and are not limited to the present disclosure is.

In addition, the air inlet 162 of the wind scooper 160 has a positioning column 162a, and each of the first air outlets 164 has a fastener 164a. The wind scooper 160 can be fixed on the fan module 150 and the heating modules 130 via the positioning column 162a and the fastener 164a. Therefore, the wind scooper 160 can be stably combined with other parts of the electronic device 100 without additional fixing elements. More detailed descriptions are given hereafter.

Figure 4:
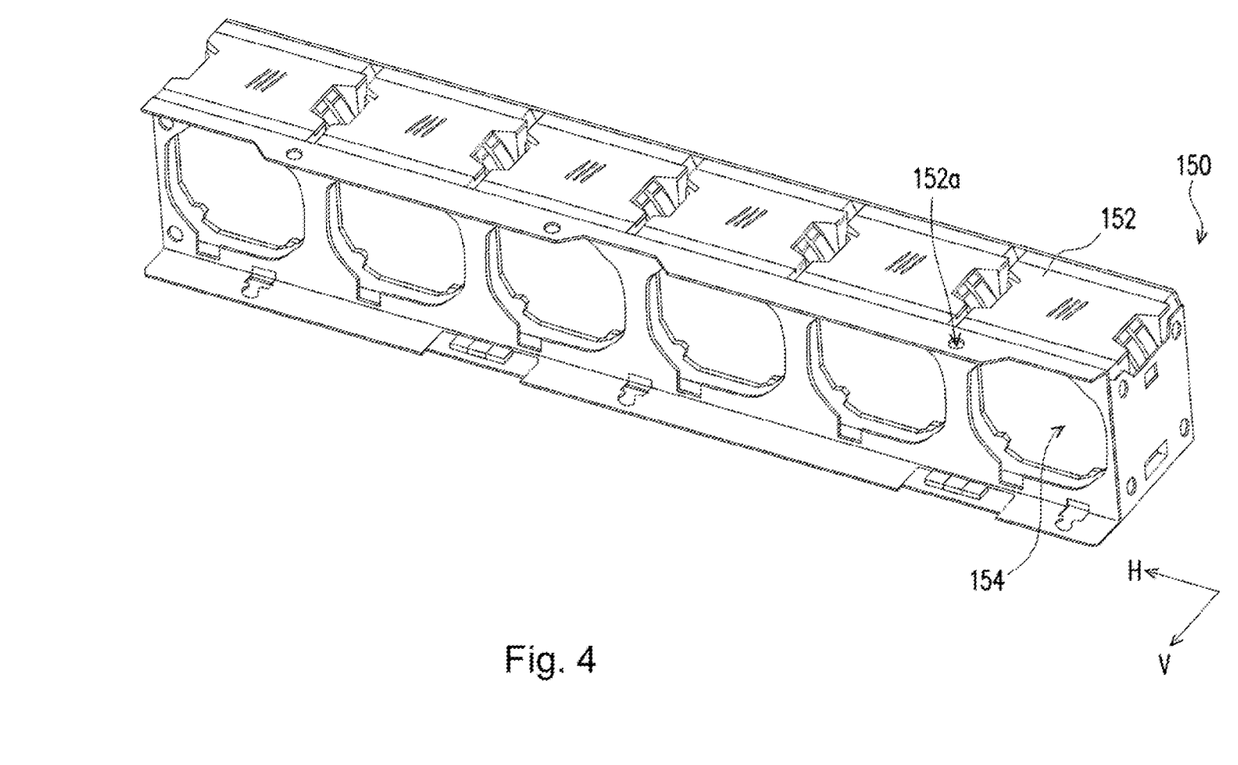
FIG. 4 is a schematic diagram of a fan module shown in FIG. 1.

FIG. 4 is a schematic diagram of a fan module shown in FIG. 1. Referring to FIGS. 1 and 4, in this embodiment, the fan module 150 includes a fan bracket 152 and a plurality of fans 154. The fans 154 are arranged in the fan bracket 152. The fan module 150 of this embodiment is described as having six fans 154. However, in other embodiments, the number of the fans may be regulated according to the demands. The fans 154 are arranged in one row along the transverse direction H in the fan bracket 152, and further face the first electronic module 120, the heating modules 130, the memory modules 140 and the second electronic modules 180, so that the fans 154 can provide the first airflow A1 and the second airflow A2 along the longitudinal direction V, and further blow the first airflow A1 and the airflow A2 to the first electronic module 120, the heating modules 130, the memory modules 140 and the second electronic module 180 to provide the heat dissipation function.

Figure 5:
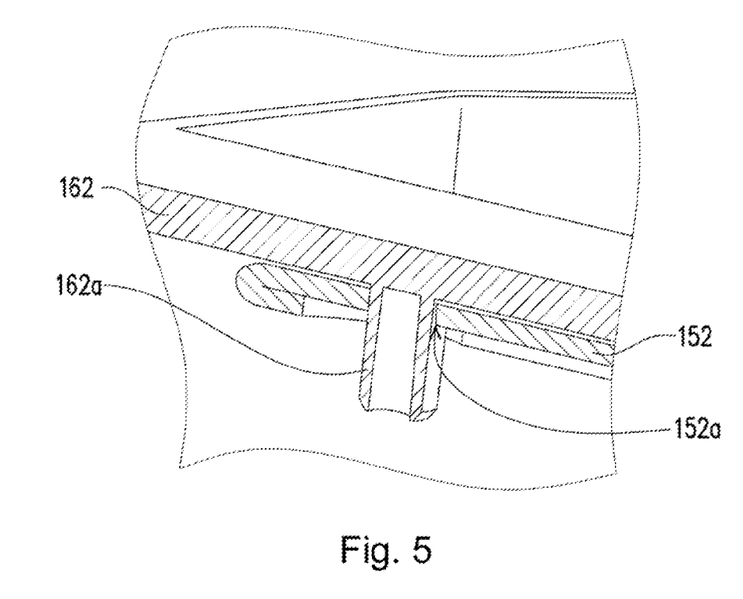
FIG. 5 is a partially-enlarged cross-sectional view of the electronic device shown in FIG. 1.

FIG. 5 is a partially-enlarged cross-sectional view of the electronic device shown in FIG. 1. Referring to FIGS. 3 to 5, in this embodiment, the air inlet 162 of the wind scooper 160 has three positioning columns 162a. The fan bracket 152 has three positioning holes 152a, which are located on the upper edge of the fan bracket 152. However, the number and the position of the positioning columns 162a and the positioning holes 152a are not limited in the present disclosure, and adjustments may be made thereto according to the demands in each embodiment. The upper edge of the fan bracket 152 corresponds to that of the air inlet 162, so that the wind scooper 160 is assembled onto the fan module 150 by enabling the positioning columns to correspondingly penetrate into the positioning holes 152a. Therefore, the air inlet 162 of the wind scooper 160 can precisely correspond to the fans 154 of the fan module 150, so that the airflow concentration is improved and the wind scooper 160 is prevented from being displaced.

Figure 6:
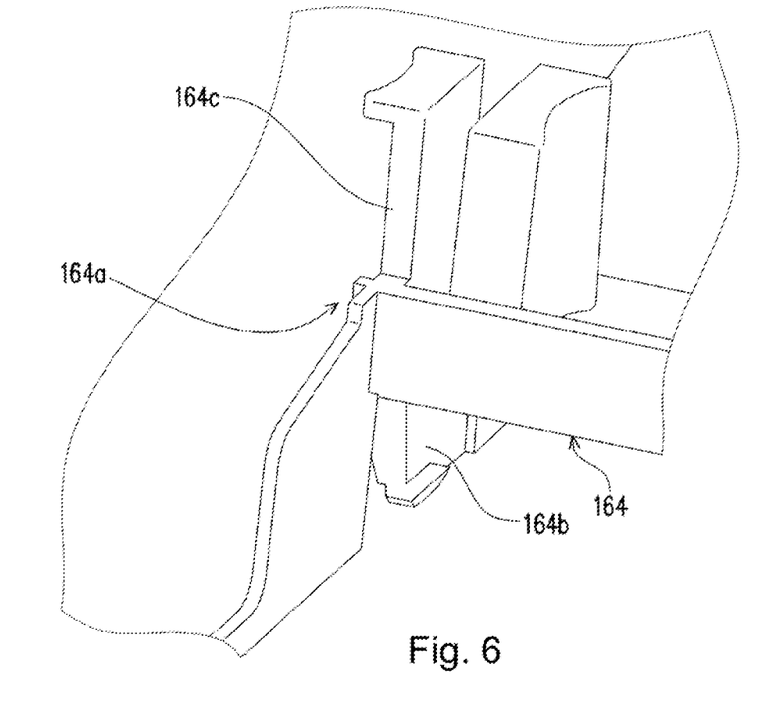
FIG. 6 is a partially-enlarged schematic diagram a first air outlet shown in FIG. 1.
Figure 7:
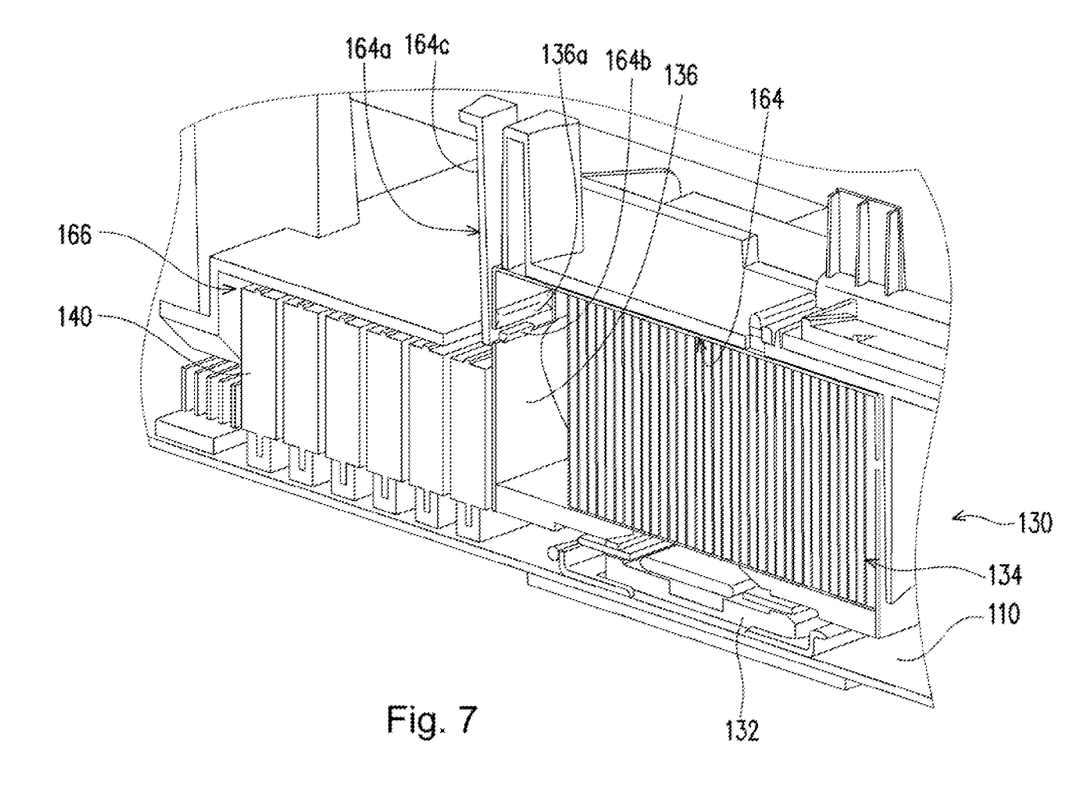
FIG. 7 is a partially-enlarged cross-sectional view of the electronic device shown in FIG. 1.

FIG. 6 is a partially-enlarged schematic diagram of a first air outlet shown in FIG. 1. FIG. 7 is a partially-enlarged cross-sectional view of the electronic device shown in FIG. 1. Referring to FIGS. 1, 6 and 7, in this embodiment, each of the heating modules 130 includes a heating element 132, a heat dissipation element 134 and a heat dissipation enclosure 136. The heating element 132, for example, is a central processing unit or other elements which generate heat in operation, but the type of the heating element is not limited in the present disclosure. The heating element 132 is arranged on the motherboard 110. The heat dissipation element 134 is arranged in the heat dissipation enclosure 136 and further thermally coupled with the heating element 132. The heat dissipation element 134, for example, is a heat dissipation fin group. The heat dissipation enclosure 136, for example, is a metal sheet enclosure. However, the type and the materials of the heat dissipation elements and the heat dissipation enclosure are not limited in the present disclosure. Therefore, the heating element 132 can dissipate heat through the heat dissipation element 134. However, since the heat dissipation efficiencies of the heat dissipation elements 134 are limited, all of the heating modules 130 are still in the heat generation state. As a result, the first airflow A1 flowing through the heating modules 130 is heated. In addition, the memory module 140, for example, is a memory card group, but the type of the memory module is not limited in the present disclosure.

Additionally, the heat dissipation enclosure 136 has a fastening convex part 136a. Each of the first air outlets 164 of the wind scooper 160 has a corresponding fastener 164a. The fastener 164a has a fastening hook part 164b and a pressing part 164c. The fastening hook part 164b is located in the first air outlet 164, and the pressing part 164c protrudes above the first air outlet 164. Therefore, the wind scooper 160 is fixed to the heating module 130 by fastening the fastening hook parts 164 correspondingly into the fastening convex parts 136a. For the wind scooper 160, the fastening relation between the fastening hook part 164b and the fastening convex part 136a is released by pressing the pressing part 164c.

It can be seen that the wind scooper 160 can guide the first airflow A1 to flow to the heating modules 130 and the memory modules 140 from the fan module 150 so as to improve the heat dissipation efficiency of the electronic device 100, and also the wind scooper 160 can be directly fixed on the heating modules 130, so that the wind scooper 160 is prevented from being displaced, and the wind scooper 160 can be easily assembled and disassembled, so as to facilitate the installation of the wind scooper 160 and the repair of the heating modules 130 or the memory modules 140 which are covered by the wind scooper 160 and located in the lower-layer airflow passage C1.

Figure 8:
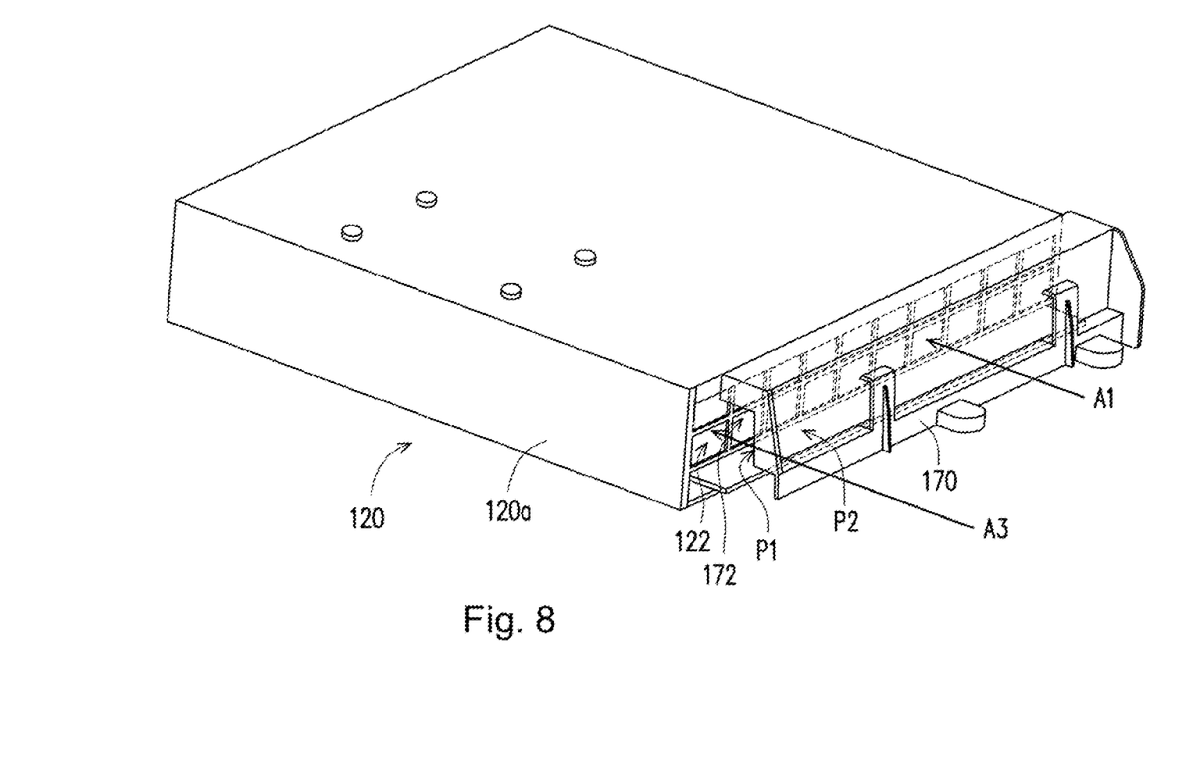
FIG. 8 is schematic diagrams of a power module and a power-supply wind scooper shown in FIG. 2.

FIG. 8 is schematic diagrams of a power module and a power-supply wind scooper shown in FIG. 2. Referring to FIGS. 2 and 8, in this embodiment, the power module 120a used as the first electronic module 120, has a power-supply opening 122. The power-supply opening 122 is arranged towards the fan module 150 and further faces the lower-layer airflow passage C1, the heat dissipation module 130 and the memory module 140. The power-supply wind scooper 170 is arranged on the power module 120a and further shields a part of the power-supply opening 122. Therefore, after the first airflow A1 passes through the heating modules 130 and the memory modules 140 from the first air outlets 164 and the second air outlets 166, the power-supply wind scooper 170 can prevent the first airflow A1 of which the temperature is risen from flowing into the power module 120a from the power-supply opening 122.

Additionally, in this embodiment, the power-supply wind scooper 170 has an air inlet 172, which is located on one side of the power-supply wind scooper 170 and further corresponds to the part of the power-supply opening 122 not shielded by the power-supply wind scooper 170. Between the wind scooper 160 and a lateral wall of the case 102 there is a gap 168 (as shown in FIGS. 1 and 2). Therefore, the third airflow A3 provided by the fan module 150 flows into the interior of the case 102 from the gap 168, without flowing through the lower-layer airflow passage C1 and the upper-layer airflow passage C2. The power-supply wind scooper 170 is arranged on the power module 120a and further shields a part of the power-supply opening 122; the third airflow A3 provided by the fan module 150 flows to the power module 120a along the gap 168. A part of the third airflow A3 enter the power module 120a through the part of the power-supply opening 122 not shielded by the power-supply wind scooper 170 and another part of the third airflow A3 passes through the air inlet 172 and the part of the power-supply opening 122 shielded by the power-supply wind scooper 170 in sequence to enter the power module 120a.

Therefore, the air inlet 172 of the power-supply wind scooper implements the heat dissipation function by guiding the third airflow A3 which does not carry the heat into the power module 120a. Accordingly, the power-supply wind scooper 170 can prevent the heated first airflow A1, and guide the third airflow A3 which directly flows out from the fan module 150 into the power module 120a, so as to improve the heat dissipation efficiency and decrease the operational temperature of the power module 120 effectively. Additionally, in this embodiment, the power module 120a also may be provided with plural built-in fans (not shown) to improve the heat dissipation efficiency of the power module 120a, but the present disclosure is not limited to that.

Figure 9:
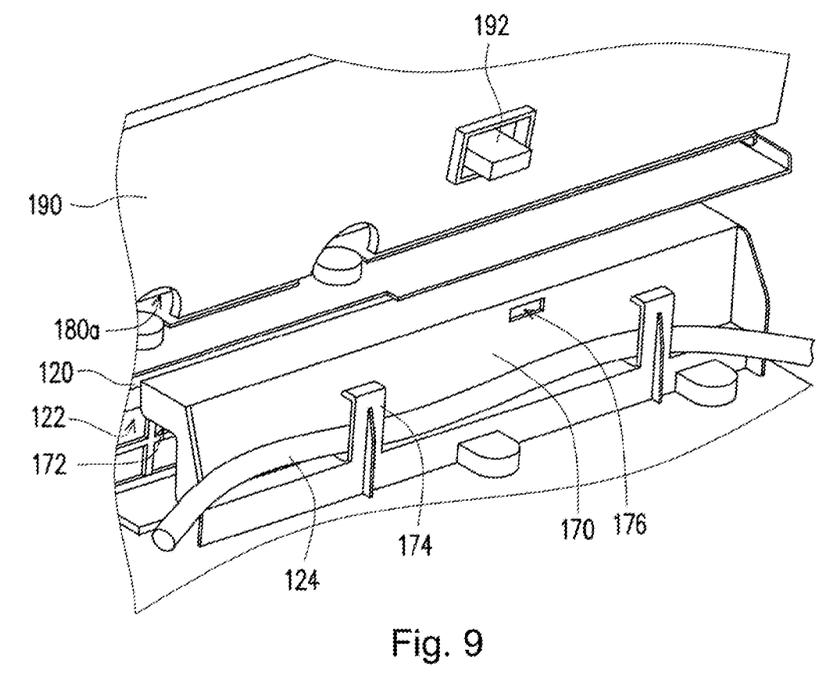
FIG. 9 is a partially-enlarged schematic diagram of the power-supply wind scooper shown in FIG. 2.

FIG. 9 is a partially-enlarged schematic diagram of the power-supply wind scooper shown in FIG. 2. Referring to FIG. 9, in this embodiment, the power-supply wind scooper 170 also has a line arrangement function. Particularly, the power-supply wind scooper 170 has an internal face P1 facing the power-supply opening 122 and an external face P2 facing the fan module 150. The electronic device 100 further includes a power line 124, which connects the motherboard 110 with the power module 120a. The power line 124 is arranged on the external face P1 of the power-supply wind scooper 170, so that the motherboard 110 is prevented from being interfered. A part of the second airflow A2 flows into the power module 120a through the internal face P1 from the power-supply opening 122.

Particularly, the power-supply wind scooper 170 has a line arrangement hook 174, which is located on the external face P2 of the power-supply wind scooper 170. The power line 124 is fixed on the power-supply wind scooper 170 by the line arrangement hook 174. Accordingly, the power line 124 may be placed between the line arrangement hook 174 and the external face P2, so that the power line 124 is prevented from being directly scattered on the motherboard 110 to interfere the operation of other electronic parts on the motherboard 110. Also, additional space is left in the interior of the electronic device 100 to accommodate other electronic parts. As such, it does not need to use additional wire clamps for fixing the power line 124 on the motherboard 110. In this way, the space configuration of the electronic device 100 can be improved.

Additionally, referring to FIG. 2 again, in this embodiment, the second electronic module 180 is a hard disk module 180a. The hard disk module 180a is stacked above the power module 120a, and further has a hard disk opening 182. The hard disk opening 182 faces the fan module 150. The hard disk module 180a, for example, consists of a hard disk rack 184 and two hard disks 196. The hard disks 186, for example, are large-scale hard disks (LFF) which are arranged side by side or laminated in the hard disk rack 184. However, the compositions of the hard disk module, and the number and the type of the hard disks are not limited in the present disclosure. Therefore, the second airflow A2 can flow towards the hard disk module 180a, and further flow into the hard disk module 180a from the hard disk opening 182, to decrease the operation temperature of the hard disk module 180a.

Additionally, a hard disk wind scooper 190 is arranged on the hard disk module 180a, and further is capable of rotating relative to the hard disk module 180a, to shield or expose the hard disk opening 182. Therefore, the hard disk wind scooper 190 can optionally shield or expose the hard disk opening 182 according to the demands. The hard disk wind scooper 190 is rotatable between a first position and a second position; when the hard disk wind scooper 190 is at the first position, the hard disk wind scooper 190 shields the hard disk opening 182; when the hard disk wind scooper 190 is at the second position, the hard disk wind scooper 190 exposes the hard disk opening 182 to the fan module 150 so that the second airflow A2 passing through the upper-layer airflow passage C2 flows along a top face of the hard disk wind scooper 190 to enter the hard disk module 180a through the hard disk opening 182. The hard disk wind scooper 190 can be rotatably put down to the second position and rotatably put up to the first position. When the hard disk wind scooper 190 exposes the hard disk opening 182 (as the state shown in FIG. 2), the second airflow A2 flows into the hard disk module 180a, and the hard disk wind scooper 190 may be fixed on the power-supply wind scooper 170, so that the first airflow A1 flowing through the heating modules 130 is prevented from flowing into the hard disk module 180a.

Figure 10:
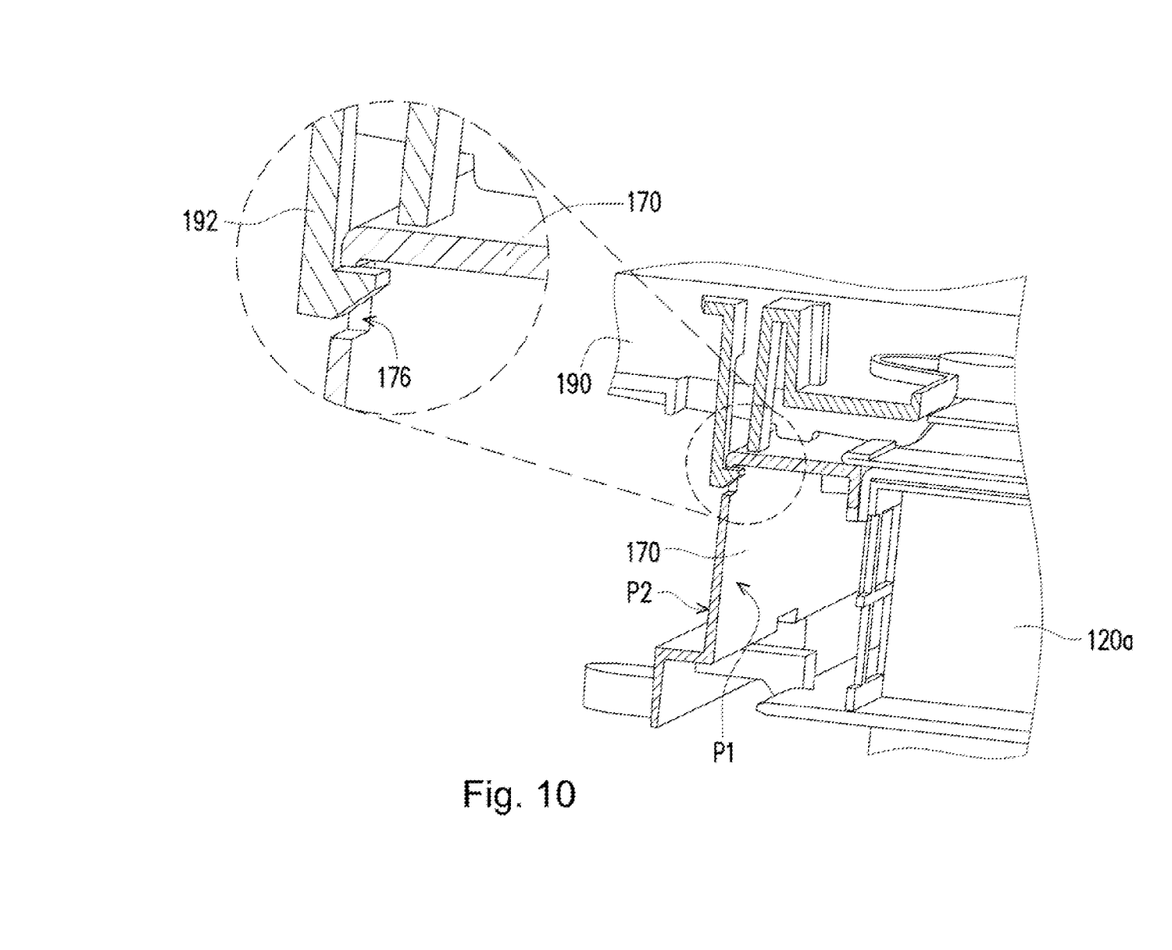
FIG. 10 partially-enlarged cross-sectional views of the power-supply wind scooper and a hard disk wind scooper shown in FIG. 2.

FIG. 10 is partially-enlarged cross-sectional diagram of the power-supply wind scooper and a hard disk wind scooper shown in FIG. 2. Referring to FIGS. 9 and 10, particularly, in this embodiment, the hard disk wind scooper 190 has a fixing hook 192. The power-supply wind scooper 170 has a fixing hole 176 which is located on the top part of the power-supply wind scooper 170. When the hard disk wind scooper 190 rotates relative to the hard disk module 180a to expose the hard disk opening 182 (as the process converting from the state shown in FIG. 9 to the shown in FIG. 10), the hard disk wind scooper 190 is fixed on the power-supply wind scooper 170 by fastening the fixing hook 192 into the fixing hole 176.

It can be seen that the hard disk wind scooper 190 can be easily fixed on the power-supply wind scooper 170 without other fixing pieces, so that the hard disk wind scooper 190 is prevented from shaking to strike other electronic parts during the process of transporting the electronic device 100. In addition, when the hard disk wind scooper 190 rotates relative to the hard disk module 180a to shield the hard disk opening 182, the fixing hook 192 can be easily moved out of the fixing hole 176. As such, the electronic device 100 can be assembled in a simple way.

As described above, the present disclosure provides an electronic device. The wind scooper covers the heating modules, and further forms the lower-layer airflow passage and the upper-layer airflow passage through the partition board. Therefore, the first airflow provided by the fan module is guided to flow through the heating modules and the memory modules along the lower-layer airflow passage, and the second airflow provided by the fan module is guided to flow to the second electronic module along the upper-layer airflow passage without flowing through the heating modules. Additionally, the third airflow provided by the fan module is guided to flow to the first electronic module from the gap, so that the operation temperatures of the first electronic module, the heating modules, the memory modules, the second electronic module and other electronic parts are decreased. In addition, the wind scooper can be directly assembled to the fan module and the heating modules without using additional fixing pieces. Additionally, the power-supply wind scooper is capable of preventing the first airflow which is heated when flowing through the heating modules and the memory modules from flowing into the power module. Furthermore, the power-supply wind scooper has the line arrangement function, which enables the hard disk wind scooper to be fixed thereon. As such, the electronic device has good heat dissipation efficiency; the space configuration thereof is improved; the assembling stability is good and electronic device can be assembled in a simple way.

Although the present disclosure has been disclosed with reference to the above embodiments, these embodiments are not intended to limit the present disclosure. It will be apparent to those skilled in the art that various modifications and variations can be made without departing from the scope or spirit of the present disclosure. Therefore, the scope of the present disclosure shall be defined by the appended claims.

What is claimed is:

1. An electronic device, comprising:
   a motherboard;
   a plurality of heating modules, arranged on the motherboard;

a first electronic module, arranged on a front side of the motherboard along a longitudinal direction perpendicular to a transverse direction;

a second electronic module, arranged on the front side of the motherboard, and further stacked above the first electronic module;

a fan module, being located on a rear side of the motherboard along the transverse direction, and further facing the heating modules and the second electronic module; and a wind scooper, wherein the wind scooper covers the heating modules and has a partition board extending toward the first electronic module, so as to form a lower-layer airflow passage between the partition board and the motherboard and form an upper-layer airflow passage above the partition board; wherein the wind scooper guides a first airflow provided by the fan module to flow through the heating modules along the lower-layer airflow passage, and guides a second airflow provided by the fan module to flow to the second electronic module along the upper-layer airflow passage without flowing through the heating modules.

2. The electronic device of claim 1, wherein the electronic device further comprises:

a power-supply wind scooper, wherein the first electronic module is a power module; the power module a power-supply opening; the power-supply opening is arranged toward the fan module and further faces the lower-layer airflow passage and the heating modules; and the power-supply wind scooper is arranged to shield a part of the power-supply opening, so that the first airflow flowing through the heating modules is prevented by the power-supply wind scooper from flowing into the power module.

3. The electronic device of claim 2, further comprising a case, wherein the motherboard is arranged in the case; the case has a lateral wall adjacent to the wind scooper and the power module; the power-supply wind scooper has an air inlet, located on one side of the power-supply wind scooper and further facing the lateral wall; a third airflow provided by the fan module flows to the power module along a gap between the lateral wall and the wind scooper; a part of the third airflow enters the power module through the part of the power-supply opening not shielded by the power-supply wind scooper and another part of the third airflow passes through the air inlet and the part of the power-supply opening shielded by the power-supply wind scooper in sequence to enter the power module.

4. The electronic device of claim 2, wherein the electronic device further comprises:

a power line, connecting the motherboard with the power module, wherein the power-supply wind scooper has an internal face facing the power-supply opening and an external face facing the fan module; the power line is arranged on the external face of the power-supply wind scooper so that the motherboard is prevented from being interfered.

5. The electronic device of claim 4, wherein the power-supply wind scooper has a line arrangement hook, located on the external face of the power-supply wind scooper; and the power line is fixed on the power-supply wind scooper by the line arrangement hook.

6. The electronic device of claim 1, wherein the wind scooper comprises an air inlet and a plurality of first air outlets; the air inlet of the wind scooper, corresponding to the fan module, is located on a first side of the wind scooper; and the first air outlets, corresponding to the heating modules, are arranged in the lower-layer airflow passage, and further located on a second side of the wind scooper opposite to the first side, so that the first airflow flows through the heating modules via the first air outlets from the air inlet.

7. The electronic device of claim 6, wherein the fan module comprises a fan bracket and a plurality of fans; the fans are arranged in the fan bracket; the fan bracket has at least one positioning hole; the air inlet has at least one positioning column; and the wind scooper is assembled to the fan module by enabling the positioning columns to correspondingly penetrate into the positioning holes.

8. The electronic device of claim 6, wherein each of the heating modules comprises a heating element, a heat dissipation element and a heat dissipation enclosure; the heat dissipation element is arranged in the heat dissipation enclosure and further thermally coupled with the heating element; the heat dissipation enclosure has a fastening convex part; each of the first air outlets has a corresponding fastener; the fastener has a fastening hook part; and the wind scooper is fixed to the heating modules by fastening the fastening hook parts correspondingly onto the fastening convex parts.

9. The electronic device of claim 8, wherein each of the fasteners has a pressing part; the pressing part protrudes above the first air outlet; and the fastening relation between the fastening hook parts and the fastening convex parts are released by pressing the pressing parts.

10. The electronic device of claim 6, wherein the electronic device further comprises:

at least one memory module, arranged on the motherboard along the transverse direction and further adjacent to the heating modules, wherein the wind scooper further comprises at least one second air outlet, corresponding to the at least one memory module, and the second air outlet is arranged in the lower-layer airflow passage and further located on the second side of the wind scooper, so that the first airflow flows through the memory module via the second air outlets from the air inlet.

11. The electronic device of claim 10, wherein the number of the heating modules and the number of the at least one memory module are both two, and the two heating modules and the two memory modules are staggerly arranged on the motherboard; and the number of the at least one first air outlet and the number of the at least one second air outlet are both two, and the two first air outlets and the two second air outlets are staggerly arranged on the second side, so that the first air outlets and the second air outlets respectively correspond to the heat dissipation modules and the memory modules.

12. The electronic device of claim 1, further comprising a power-supply wind scooper, wherein the first electronic module is a power module; the power module has a power-supply opening; the power-supply opening is arranged toward the lower-layer airflow passage; the power-supply wind scooper is arranged between the power-supply opening and the heating modules to prevent the first airflow from flowing into the power module through the power-supply opening.

13. The electronic device of claim 12, wherein the electronic device further comprises:

a hard disk wind scooper, wherein the second electronic module is a hard disk module; the hard disk module has a hard disk opening; the hard disk opening is arranged towards the upper-layer airflow passage; the hard disk wind scooper is attached to the hard disk module, and further is rotatable between a first position and a second position; when the hard disk wind scooper is at the first position, the hard disk wind scooper shields the hard disk opening; when the hard disk wind scooper is at the second position, the hard disk wind scooper exposes the hard disk opening to the fan module so that the second airflow passing through the upper-layer airflow passage flows along a top face of the hard disk wind scooper to enter the hard disk module through the hard disk opening.

14. The electronic device of claim 13, wherein when the hard disk wind scooper is at the second position, the power-supply wind scooper between the hard disk wind scooper and the motherboard so that the first airflow flowing through the heating modules is prevented by the hard disk wind scooper from spreading upwardly to enter the hard disk module.

15. The electronic device of claim 13, wherein the hard disk wind scooper has a fixing hook; the power-supply wind scooper has a fixing hole located on a top part of the power-supply wind scooper; and when the hard disk wind scooper is at the second position, the hard disk wind scooper is attached to the power-supply wind scooper by fastening the fixing hook into the fixing hole.

16. The electronic device of claim 13, further comprising a gap layer between the power module and the hard disk module, wherein at least part of the first airflow flows out of the electronic device via the gap layer.

17. The electronic device of claim 16, wherein the at least part of the first airflow flows into the gap layer via a gap between the hard disk wind scooper and the power-supply wind scooper.

18. The electronic device of claim 1, wherein the electronic device further comprises:
a case, having an accommodation space; and the motherboard and the fan module are arranged in the case, so that the first airflow and the second airflow flow in the accommodation space through the wind scooper, and further flow out of the case for heat dissipation.

* * * * *